(12) United States Patent
Norris

(10) Patent No.: US 9,748,915 B2
(45) Date of Patent: Aug. 29, 2017

(54) ELECTRONIC DEVICE WITH THRESHOLD BASED COMPRESSION AND RELATED DEVICES AND METHODS

(71) Applicant: HARRIS CORPORATION, Melbourne, FL (US)

(72) Inventor: James A. Norris, Fairport, NY (US)

(73) Assignee: HARRIS CORPORATION, Melbourne, FL (US)

( * ) Notice: Subject to any disclaimer, the term of this patent is extended or adjusted under 35 U.S.C. 154(b) by 15 days.

(21) Appl. No.: 14/862,436

(22) Filed: Sep. 23, 2015

(65) Prior Publication Data
US 2017/0085240 A1    Mar. 23, 2017

(51) Int. Cl.
*H04B 5/00* (2006.01)
*H03G 11/04* (2006.01)
(Continued)

(52) U.S. Cl.
CPC .............. *H03G 11/04* (2013.01); *G06F 3/16* (2013.01); *H03G 7/002* (2013.01); *H03G 7/007* (2013.01);
(Continued)

(58) Field of Classification Search
CPC .... H04R 3/007; H04R 2499/11; H04R 3/002; H04R 29/001; H04R 3/04; H04R 25/356; H04R 25/70; H04R 2225/67; H04R 25/502; H04R 1/10; H04R 2225/43; H04R 2420/01; H04R 25/505; H04R 29/003; H04R 3/00; H04R 5/04; H04R 2430/03; H04R 25/353; H04R 1/46; H04R 2225/41; H04R 2430/00; G10L 19/008; G10L 19/00; G10L 19/167; H03G 9/005; H03G 3/3089; H03G 7/007; H03G 5/005
(Continued)

(56) References Cited

U.S. PATENT DOCUMENTS 4,641,361 A    2/1987  Rosback
5,758,273 A    5/1998  Marks
(Continued)

FOREIGN PATENT DOCUMENTS

WO    2012009572 A1    1/2012

OTHER PUBLICATIONS

Rapp, "Effects of HPA-Nonlinearity on a 4-DPSK-OFDM-Signal for a Digital Sound Broadcasting System," Proceedings of the Second European Conference on Satellite Communications, Oct. 22-24, 1991, Liege, Belgium, pp. 179-184.
(Continued)

*Primary Examiner* — Akelaw Teshale
(74) *Attorney, Agent, or Firm* — Allen, Dyer, Doppelt + Gilchrist, P.A.

(57) ABSTRACT

An electronic device may include a speaker, and audio circuitry coupled to the speaker. The audio circuitry may generate digitized samples of an audio waveform signal, and compare each digitized sample of the audio waveform signal to a threshold. The audio circuitry may when a given digitized sample is above the threshold, then apply a compression operation to the given digitized sample and successive digitized samples for a set time period, and when the given digitized sample is below the threshold and not within the set time period, then not apply the compression operation.

21 Claims, 3 Drawing Sheets

(51) Int. Cl.
*G06F 3/16* (2006.01)
*H04R 3/00* (2006.01)
*H04W 88/02* (2009.01)
*H03G 7/00* (2006.01)

(52) U.S. Cl.
CPC .............. *H04R 3/00* (2013.01); *H04W 88/02* (2013.01); *H04R 2499/11* (2013.01)

(58) Field of Classification Search
USPC ..... 381/106, 55, 59, 104, 98, 100, 107, 321, 381/111, 116, 120, 312, 58, 96, 101, 56, 381/57, 94.3, 79, 17, 303, 316, 71.1, 381/71.2, 71.6, 94.8
See application file for complete search history.

(56) References Cited

U.S. PATENT DOCUMENTS

| | | | |
|---|---|---|---|
| 5,768,364 A * | 6/1998 | Karnowski | H04M 9/08 379/388.02 |
| 6,201,680 B1 | 3/2001 | Tokatian | |
| 6,201,873 B1 * | 3/2001 | Dal Farra | H03G 3/32 381/100 |
| 7,800,440 B2 * | 9/2010 | Nishimura | H03G 7/002 330/278 |
| 8,750,525 B2 | 6/2014 | Martz et al. | |
| 8,983,092 B2 | 3/2015 | Thormundsson et al. | |
| 2002/0123897 A1 * | 9/2002 | Matsumoto | G10L 13/06 704/500 |
| 2002/0133356 A1 | 9/2002 | Romesburg | |
| 2003/0014247 A1 * | 1/2003 | Ng | G10L 17/06 704/209 |
| 2009/0009251 A1 | 1/2009 | Spielbauer | |
| 2010/0254546 A1 | 10/2010 | Hosomi | |
| 2011/0044471 A1 * | 2/2011 | Aarts | H04R 3/04 381/98 |
| 2011/0064391 A1 * | 3/2011 | Hisamoto | H04N 5/93 386/354 |
| 2012/0002819 A1 | 1/2012 | Thormundsson et al. | |
| 2012/0281844 A1 | 11/2012 | Luo et al. | |
| 2012/0328117 A1 * | 12/2012 | Gautama | H03F 1/52 381/59 |
| 2013/0142360 A1 * | 6/2013 | Potard | H03G 9/18 381/98 |
| 2013/0329894 A1 * | 12/2013 | Krishnaswamy | H03G 11/00 381/55 |
| 2014/0114654 A1 | 4/2014 | Brajbhushan et al. | |
| 2014/0297292 A1 * | 10/2014 | Marko | G10L 19/00 704/500 |
| 2017/0047071 A1 * | 2/2017 | Melkote | G10L 19/008 |

OTHER PUBLICATIONS

"Dynamic Range Compression," Wikipedia, the free encyclopedia. Retrieved from the Internet from https://en.wikipedia.org/wiki/dynamic_range_compression, Sep. 23, 2015, pp. 1-10.

* cited by examiner

ELECTRONIC DEVICE WITH THRESHOLD BASED COMPRESSION AND RELATED DEVICES AND METHODS

TECHNICAL FIELD

The present disclosure relates to the field of electronic devices, and, more particularly, to electronic devices with speakers and related methods.

BACKGROUND

Wireless communications devices are an integral part of society and permeate daily life. The typical wireless communications device includes an antenna, a transceiver coupled to the antenna, and an audio output/input device. The transceiver and the antenna cooperate to transmit and receive communications signals. A typical wireless communications device includes a power amplifier for amplifying low amplitude signals for output via an audio output device, such as a speaker, for example.

In the typical wireless communications device, the audio performance of the speaker can be limited. This is generally due to the low power amplifier and the size of the speaker. Indeed, in mobile applications, these restraints on design are quite pronounced. Also, a voice based audio output signal may be difficult to process due to its high peak-to-average ratio. Because of this, the typical mobile wireless communications device may provide audio output with significant distortion, which is undesirable.

An approach to this issue is to compress the audio output signal before outputting via the speaker. In short, the compression reduces the level of the loudest signals in the audio output signal. Two facets of the audio output signal that can be regulated are the peak levels of the signal and the dynamic range of the signal.

In particular, some approaches use a fixed compression algorithm. These compression algorithms have a fixed gain where higher voltages have less gain than lower voltages. Also, the gain does not vary over time in these approaches. Other approaches use dynamic compression algorithms. These dynamic algorithms include an attack time, i.e. a time needed to attenuate the audio output signal, and a release time, i.e. a time needed to return the audio output signal to original form.

For example, U.S. Pat. No. 8,750,525 to Martz et al., also assigned to the present application's assignee, the contents of which are hereby incorporated by reference in their entirety, discloses a dynamic compression algorithm approach. Nevertheless, dynamic algorithm approaches typically cannot guarantee a peak limit and may be difficult to tune, thereby giving each device a different sound or tonality.

Also, U.S. Pat. No. 8,983,092 to Thormundsson et al. discloses another approach. This approach includes a dynamic range compressor/peak limiter comprising a look-ahead buffer and an analysis engine. The look-ahead buffer holds a window of samples of a signal. The analysis engine selects a gain envelope function on the basis of the samples by selecting the Pth sample in the buffer whenever that sample exceeds a given threshold.

SUMMARY

Generally speaking, an electronic device may comprise a speaker, and audio circuitry coupled to the speaker. The audio circuitry may be configured to generate digitized samples of an audio waveform signal, compare each digitized sample of the audio waveform signal to a threshold, and when a given digitized sample is above the threshold, then apply a compression operation to the given digitized sample and successive digitized samples for a set time period, and when the given digitized sample is below the threshold and not within the set time period, then not apply the compression operation. Advantageously, the audio circuitry may provide a high fidelity signal to the speaker.

Additionally, the audio circuitry may be configured to compare each digitized sample in the successive digitized samples to an additional threshold less than the threshold, and when a digitized sample exceeds the additional threshold, then reset the set time period. The electronic device may further include wireless circuitry configured to generate the audio waveform signal for input to the audio circuitry. The audio circuitry may comprise a compression block, a digital-to-analog converter (DAC), a power amplifier coupled downstream from the DAC, and a switch configured to selectively pass the audio waveform signal to the DAC, either directly or through the compression block.

In some embodiments, the compression block may be configured to reduce a crest factor of the audio waveform signal as an input voltage of the audio waveform signal increases. The compression block may be configured to perform a fixed curve compression operation. The fixed curve compression operation may be based upon a peak voltage of the speaker and a peak level of the audio waveform signal. The compression block may be configured to apply the compression operation to each and every successive digitized sample after the given digitized sample and for the set time period.

Another aspect is directed to a communications device comprising a portable housing, RF wireless circuitry carried by the portable housing and configured to generate an audio waveform signal, a speaker carried by the portable housing, and audio circuitry carried by the portable housing, and coupled to the speaker and the RF wireless circuitry. The audio circuitry may be configured to generate digitized samples of the audio waveform signal, and compare each digitized sample of the audio waveform signal to a threshold. The audio circuitry may be configured to when a given digitized sample is above the threshold, then apply a compression operation to the given digitized sample and successive digitized samples for a set time period, and when the given digitized sample is below the threshold and not within the set time period, then not apply the compression operation.

Yet another aspect is directed to a method for operating an electronic device comprising a speaker, and audio circuitry coupled to the speaker. The method may include operating the audio circuitry to generate digitized samples of an audio waveform signal, and operating the audio circuitry to compare each digitized sample of the audio waveform signal to a threshold. The method may include operating the audio circuitry to when a given digitized sample is above the threshold, then apply a compression operation to the given digitized sample and successive digitized samples for a set time period, and when the given digitized sample is below the threshold and not within the set time period, then not apply the compression operation.

DETAILED DESCRIPTION

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

Figure 1:
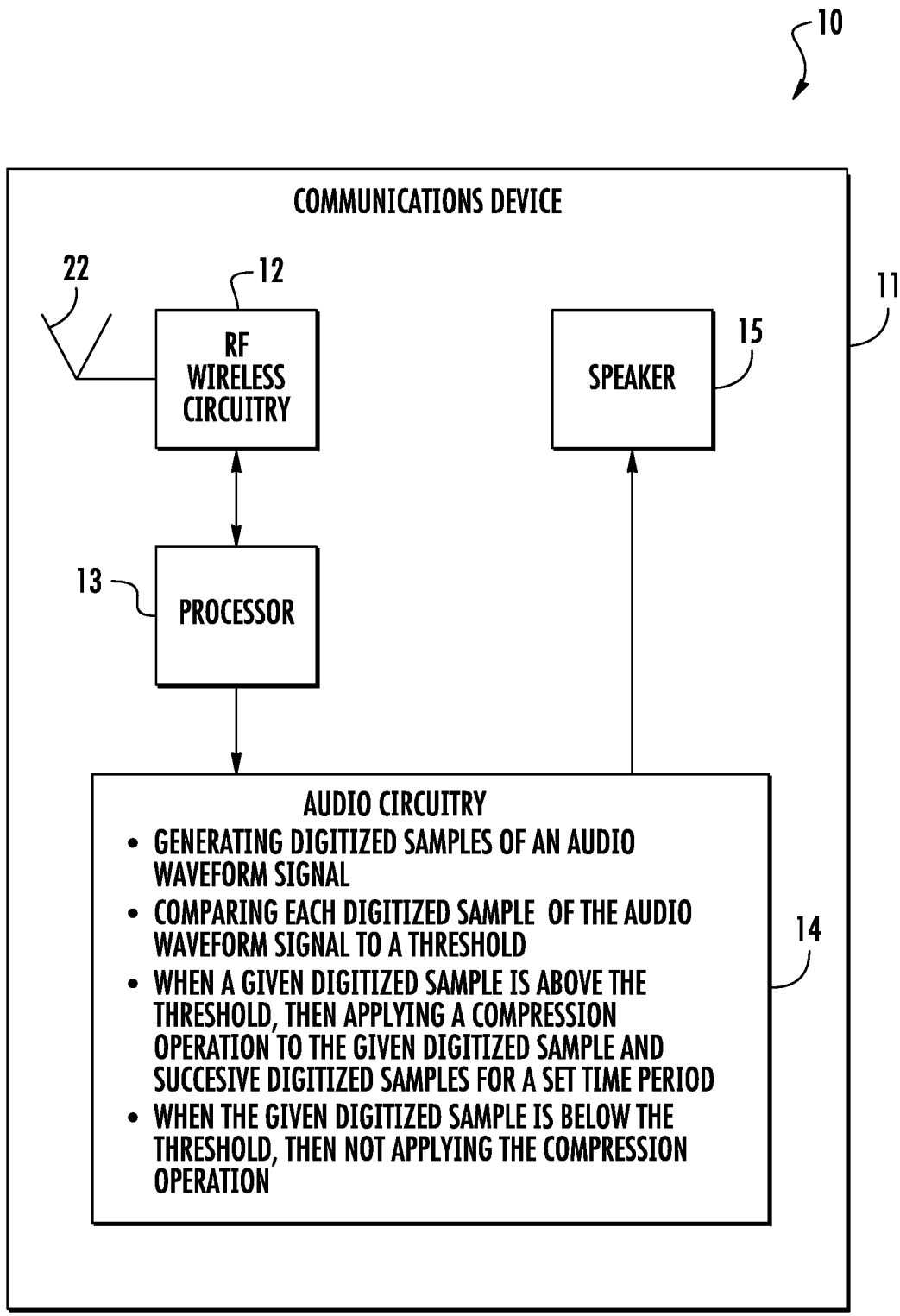
FIG. 1 is a schematic diagram of a communications device, according to the present disclosure.
Figure 2:
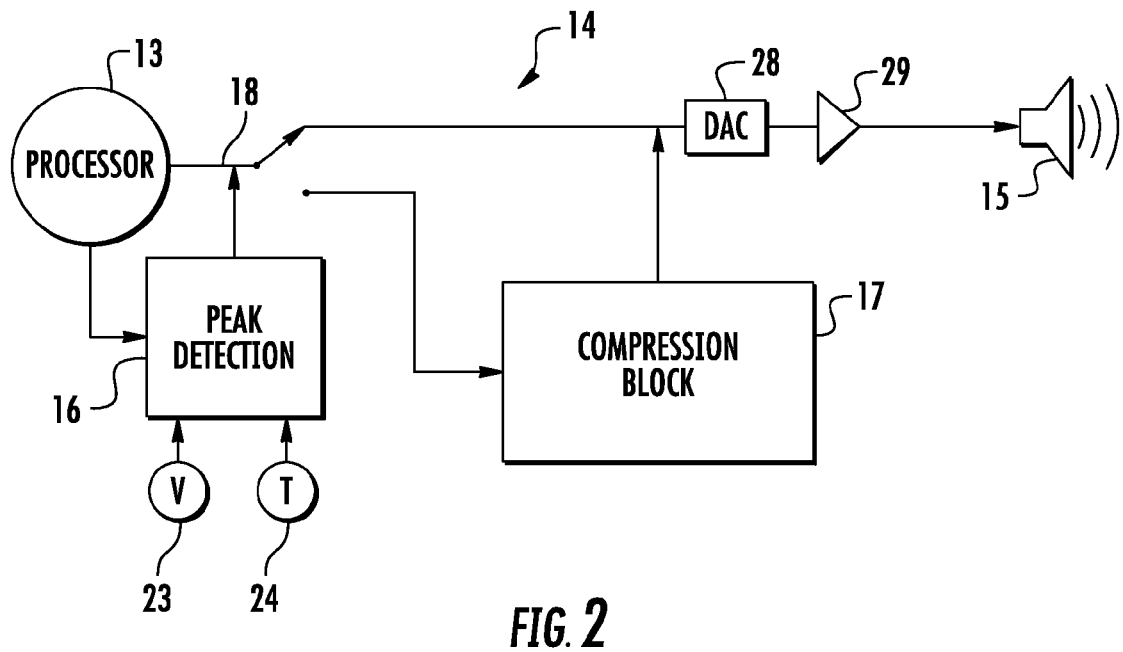
FIG. 2 is an example embodiment of the audio circuitry, the speaker, and the processor from the communications device of FIG. 1.

Referring initially to FIGS. 1-2, a communications device 10 according to the present disclosure is now described. The communications device 10 illustratively includes a portable housing 11, an antenna (e.g. whip style antenna) 22, and RF wireless circuitry 12 carried by the portable housing, coupled to the antenna, and configured to generate an audio waveform signal. For example, the portable housing 11 may have a handheld "walkie-talkie" form factor. In particular, the RF wireless circuitry 12 is configured to receive a transmitted RF signal via the antenna 22. As will be appreciated, the RF wireless circuitry 12 may include a receiver path for receiving, filtering, demodulating, and decoding the received RF signal. In some embodiments, the received RF signal comprises a Project 25 (P25/APCO-25) waveform, but other waveforms may be used in other embodiments.

The communications device 10 illustratively includes a processor 13 coupled to the RF wireless circuitry 12 and configured to manipulate a digital version of the received RF signal. The digital version of the received RF signal includes the audio waveform signal, for example, voice data.

The communications device 10 illustratively includes a speaker 15 carried by the portable housing 11, and audio circuitry 14 carried by the portable housing, and coupled to the speaker and the RF wireless circuitry 12 and processor 13. In cooperation with the processor 13, the audio circuitry 14 is configured to generate digitized samples of the audio waveform signal at a set sampling frequency.

The audio circuitry 14 illustratively includes a peak detection block 16 operating based upon a threshold 24, and a volume parameter 23. The threshold 24 represents a voltage threshold in the audio waveform signal that would potentially damage the speaker 15. The volume parameter 23 represents a user selected output level for the speaker 15, i.e. directly controlling amplifier gain. Additionally, the audio circuitry 14 illustratively includes a compression block 17, a DAC 28, a power amplifier 29 coupled downstream from the DAC, and a switch 18 coupled between the processor 13 and the DAC/compression block. For example, the compression block 17 may operate based upon a mu(μ)-law, A-law, square root, or RAPP Model (as disclosed in C. Rapp, "Effects of HPA-Nonlinearity on a 4-DPSK/OFDM Signal for a Digital Sound Broadcasting System", Proceedings of the Second European Conference on Satellite Communications, Liege, Belgium, Oct. 22-24, 1991, pp. 179-184, the contents of which are hereby incorporated by reference in their entirety) companding algorithm. Moreover, although the compression block 17 is discussed as a compression block, it should be appreciated that this block may comprise a companding block set to compress, but capable of expansion also.

The peak detection block 16 is configured to compare each digitized sample of the audio waveform signal to the threshold 24. The peak detection block 16 is configured to when a given digitized sample is above the threshold 24, then apply a compression operation to the given digitized sample and successive digitized samples for a set time period. In particular, the peak detection block 16 controls the switch 18 and directs the audio waveform signal to the compression block 17.

In some embodiments, the compression block 17 may be configured to apply the compression operation to each and every successive digitized sample after the given digitized sample and for the set time period. The set time period may comprise up to 2 seconds of samples (the number of samples depending on the sampling rate).

Also, the compression block 17 is configured to apply the compression operation to all samples for the set time period regardless of whether they exceed the threshold. In other words, the given digitized sample being above the threshold 24 starts a timer (countdown from or count up to the set time period), during which all passing samples are compressed. This is contrast to the windowed approach of the '092 patent to Thormundsson et al. Also, the timer is reset every time a new sample passes that exceeds the threshold. Because of this, the compression block 17 commonly applies the compression operation for periods longer than the set time period.

In some embodiments, the peak detection block 16 is configured to operate based upon one or more thresholds. In particular, once the given sample exceeds the threshold, each successive digitized sample after the given digitized sample and for the set time period would be compared to a second threshold (a hysteresis protection threshold), which would less than the threshold (i.e. first threshold). As will be appreciated, this will enhance the sensitivity of applying the compression operation via the compression block 17. In other words, in these embodiments, the audio circuitry 14 is configured to compare each digitized sample in the successive digitized samples to an additional threshold less than the threshold, and when a digitized sample exceeds the additional threshold, then reset the set time period.

The peak detection block 16 is configured to when the given digitized sample is below the threshold 24 and not within the set time period (i.e. the set time period running from a last sample that exceeded the threshold), then not apply the compression operation. In particular, the peak detection block 16 controls the switch 18 and directs the audio waveform signal (unadulterated/undistorted) directly to the DAC 28. In other words, the switch 18 is configured to selectively pass the audio waveform signal to the DAC 28, either directly or through the compression block 17.

In some embodiments, the communications device 10 has no a priori knowledge of the information on the content (digital, analog, etc.) of the audio waveform signal. In other words, the communications device 10 does not know the expected peak value of the audio waveform signal, or the peak-to-average ratio (crest factor), the root mean squared (RMS) value of the signal, or even if it was an analog frequency modulated (FM) signal or a digital, vocoder compressed signal. Indeed, the communications device 10 has knowledge only of the peak and average limits of the speaker 15, which the threshold 24 is based upon. This is contrast to the approach of the '092 patent to Thormundsson et al., which includes the look-ahead buffer.

Also, although the illustrated embodiment is depicted in the context of a communications device 10, it should be appreciated that the disclosed audio circuitry 14 and associated teachings may be applied to other applications. For example, the audio circuitry 14 may be applied to portable battery powered speakers, intercom stations, voice over Internet devices, etc.

Yet another aspect is directed to a method for operating an electronic device comprising a speaker 15, and audio circuitry 14 coupled to the speaker. The method may include operating the audio circuitry 14 to generate digitized samples of an audio waveform signal, and operating the audio circuitry to compare each digitized sample of the audio waveform signal to a threshold 24. The method may include operating the audio circuitry 14 to when a given digitized sample is above the threshold 24, then apply a compression operation to the given digitized sample and successive digitized samples for a set time period, and when the given digitized sample is below the threshold, then not apply the compression operation.

Figure 3:
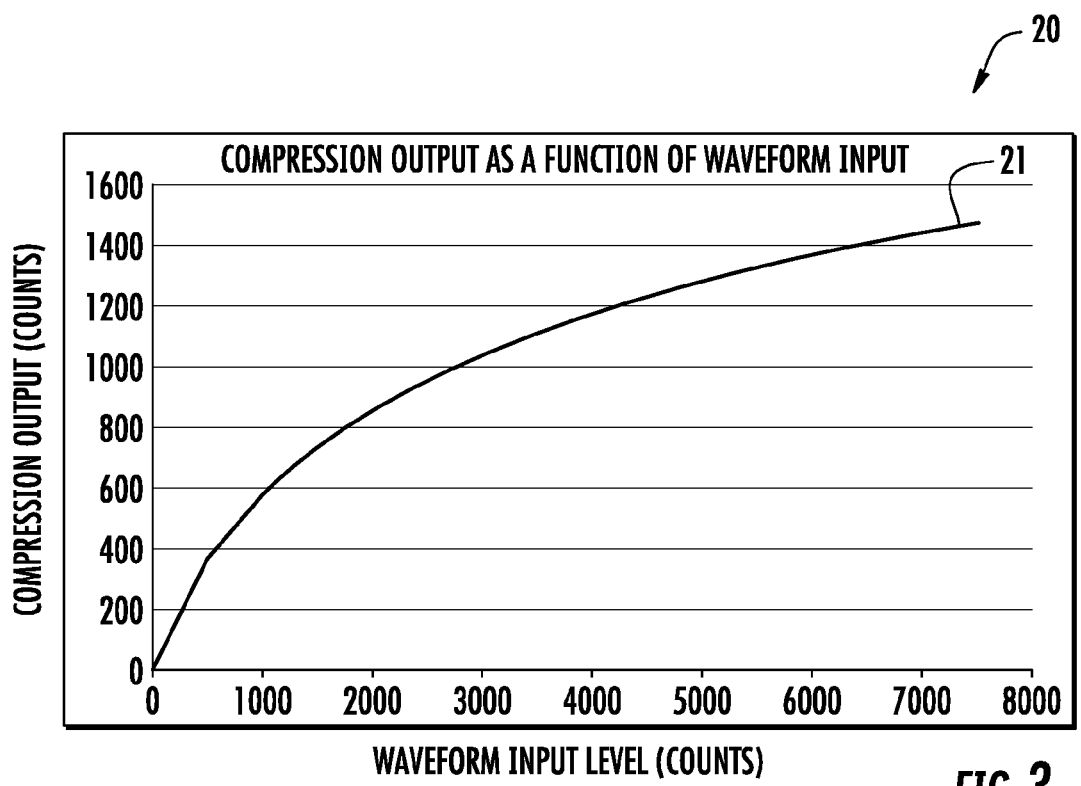
FIG. 3 is a diagram of an example compression curve for the compression block of FIG. 3.
Figure 4:
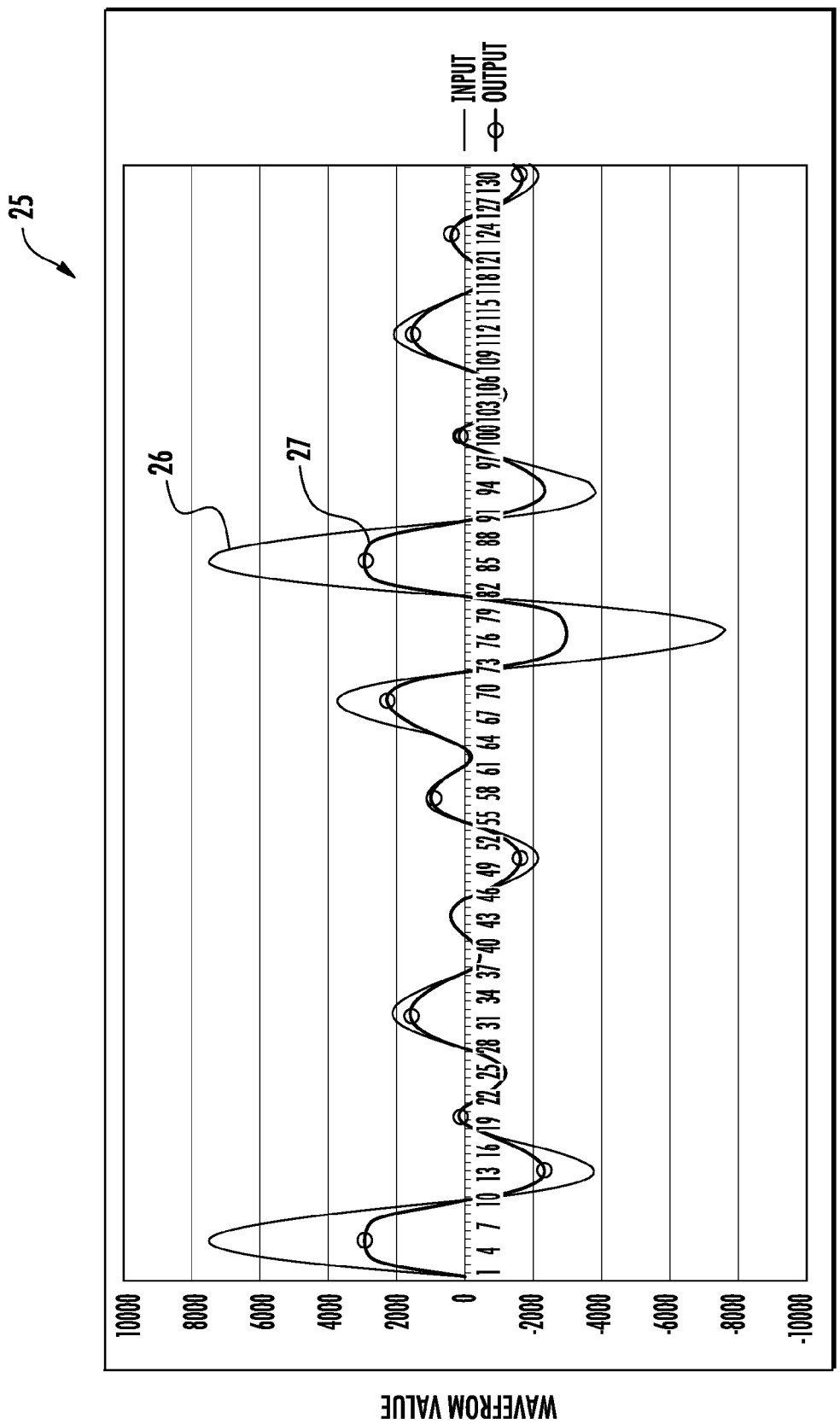
FIG. 4 is a diagram of example input and output waveforms in the communications device of FIG. 1.

Referring now additionally to FIGS. 3-4, in some embodiments, the compression block 17 may be configured to reduce a crest factor of the audio waveform signal as an input voltage of the audio waveform signal increases. Advantageously, this provides the user with audio output having a greater "punch" as the user increases the volume parameter 23 (by exponentially increasing the compression).

Also, as shown in diagram 20, the compression block 17 may be configured to perform a fixed curve compression operation. In particular, the compression curve 21 and the fixed curve compression operation may be based upon a peak voltage of the speaker 15 and a peak level of the audio waveform signal. The x-axis of the compression curve 21 is set based upon a peak level from the peak detection block 16, and the y-axis is set based upon the peak speaker voltage threshold, i.e. the threshold 24.

In another embodiment of the use of the compression curve, the x-axis of the compression curve 21 is set based upon the peak level from the peak detection block 16, and the y-axis is set based upon the peak speaker voltage threshold, i.e. the threshold 24 divided by a constant. This constant acts as a compression dial for increasing the compression. For example, in one embodiment, the constant has the value 10. In this secondary embodiment of the use of the compression curve, the resulting output would be much less than the peak speaker voltage threshold—at its maximum, it would be less by a factor of that constant (the value 10, for example). So, in this secondary embodiment, the output of the compression block would be multiplied by the constant.

As the user increases the volume parameter 23, the compression block 17 increases the compression to prevent distortion or damage to the speaker 15. In other words, the independent variable in the gain function of the compression curve 21 is input voltage, not time as in some prior approaches.

Also, when the compression operation is applied, the entire gain curve is applied—to reduce the crest factor of audio waveform signal, and so all of the audio at every part of the digital range is affected by the gain. As shown in diagram 25, the audio circuitry 14 may compress the audio waveform signal 26 and provide an output waveform 27 with minimal distortion.

In typical approaches, high crest factor audio waveforms were poorly reproduced via the speaker. As discussed above, this is largely due to the poor performance characteristics of the speaker. The communications device 10 provides an approach to this problem by selectively compressing the audio waveform signal 26, causing minimal distortion yet without damaging the speaker 15. Advantageously, the audio circuitry 14 of the communications device 10 does not provide a readily perceptible sound or tonality to the user.

Also, typical approaches that use a dynamic compression algorithm may not guarantee keeping the peak limit intact. These approaches typically employ an additional hard limiter downstream of the compression block. The audio circuitry 14 may reduce unnecessary circuitry and power usage with the compression block 17. Also, the communications device 10 advantageously may provide pure (i.e. perfect fidelity), undistorted audio when compression is unnecessary.

In short, the communications device 10 uses a fixed compression curve, but selectively applies it. For example, if the volume parameter 23 has a settable range of 1-20, the audio circuitry 14 provides no compression between the range of 1-15, minimal compression at 16, and progressively more compression between the range of 17-20 (20 having the most compression).

Moreover, the communications device 10 has a static compression, and this helpfully may eliminate many integration and test steps (dynamic compression is more complex than static compression) during design and manufacture, which decreases time to market and reduces test and verification costs. The communications device 10 may provide the user with variability in that the user selects the volume parameter 23 level and the acceptable level of distortion (compression always adds distortion).

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. An electronic device comprising:
    a speaker; and
    audio circuitry coupled to said speaker and configured to
        generate digitized samples of an audio waveform signal,
        compare each digitized sample of the audio waveform signal to a threshold, and
        when a given digitized sample is above the threshold, then apply a compression operation to the given digitized sample and each and every successive digitized sample after the given digitized sample and for a set time period, and
        when the given digitized sample is below the threshold and not within a respective set time period for a prior digitized sample exceeding the threshold, then not apply the compression operation.

2. The electronic device of claim 1 wherein said audio circuitry is configured to compare each digitized sample in successive digitized samples of the set time period to an additional threshold less than the threshold, and when a digitized sample exceeds the additional threshold, then reset the set time period.

3. The electronic device of claim 1 further comprising wireless circuitry configured to generate the audio waveform signal for input to said audio circuitry.

4. The electronic device of claim 1 wherein said audio circuitry comprises:
    a compression block;

a digital-to-analog converter (DAC);
a power amplifier coupled downstream from said DAC; and
a switch configured to selectively pass the audio waveform signal to said DAC, either directly or through said compression block.

5. The electronic device of claim 4 wherein said compression block is configured to reduce a crest factor of the audio waveform signal as an input voltage of the audio waveform signal increases.

6. The electronic device of claim 4 wherein said compression block is configured to perform a fixed curve compression operation.

7. The electronic device of claim 6 wherein the fixed curve compression operation is based upon a peak voltage of said speaker and a peak level of the audio waveform signal.

8. A communications device comprising:
a portable housing;
radio frequency (RF) wireless circuitry carried by said portable housing and configured to generate an audio waveform signal;
a speaker carried by said portable housing; and
audio circuitry carried by said portable housing, coupled to said speaker and said RF wireless circuitry, and configured to
generate digitized samples of the audio waveform signal,
compare each digitized sample of the audio waveform signal to a threshold, and
when a given digitized sample is above the threshold, then apply a compression operation to the given digitized sample and each and every successive digitized sample after the given digitized sample and for a set time period, and
when the given digitized sample is below the threshold and not within a respective set time period for a prior digitized sample exceeding the threshold, then not apply the compression operation.

9. The communications device of claim 8 wherein said audio circuitry is configured to compare each digitized sample in successive digitized samples of the set time period to an additional threshold less than the threshold, and when a digitized sample exceeds the additional threshold, then reset the set time period.

10. The communications device of claim 8 wherein said audio circuitry comprises:
a compression block;
a digital-to-analog converter (DAC);
a power amplifier coupled downstream from said DAC; and
a switch configured to selectively pass the audio waveform signal to said DAC, either directly or through said compression block.

11. The communications device of claim 10 wherein said compression block is configured to reduce a crest factor of the audio waveform signal as an input voltage of the audio waveform signal increases.

12. The communications device of claim 10 wherein said compression block is configured to perform a fixed curve compression operation.

13. The communications device of claim 12 wherein the fixed curve compression operation is based upon a peak voltage of said speaker and a peak level of the audio waveform signal.

14. A method for operating an electronic device comprising a speaker, and audio circuitry coupled to the speaker, the method comprising:
operating the audio circuitry to generate digitized samples of an audio waveform signal;
operating the audio circuitry to compare each digitized sample of the audio waveform signal to a threshold; and
operating the audio circuitry to
when a given digitized sample is above the threshold, then apply a compression operation to the given digitized sample and each and every successive digitized sample after the given digitized sample and for a set time period, and
when the given digitized sample is below the threshold and not within a respective set time period for a prior digitized sample exceeding the threshold, then not apply the compression operation.

15. The method of claim 14 further comprising operating the audio circuitry to compare each digitized sample in successive digitized samples of the set time period to an additional threshold less than the threshold, and when a digitized sample exceeds the additional threshold, then reset the set time period.

16. The method of claim 14 further comprising operating wireless circuitry to generate the audio waveform signal for input to the audio circuitry.

17. The method of claim 14 wherein the audio circuitry comprises:
a compression block;
a digital-to-analog converter (DAC);
a power amplifier coupled downstream from the DAC; and
a switch to selectively pass the audio waveform signal to the DAC, either directly or through the compression block.

18. The method of claim 17 further comprising operating the compression block to reduce a crest factor of the audio waveform signal as an input voltage of the audio waveform signal increases.

19. The method of claim 17 further comprising operating the compression block to perform a fixed curve compression operation.

20. The method of claim 19 wherein the fixed curve compression operation is based upon a peak voltage of the speaker and a peak level of the audio waveform signal.

21. The method of claim 19 wherein the fixed curve compression operation uses an output voltage lower than a peak voltage allowed by the speaker, defining a ratio of the output voltage to the peak voltage allowed by the speaker; and wherein all output voltages, after compression, are then digitally amplified by an inverse of the ratio.

* * * * *